US005614757A

United States Patent [19]

Person et al.

[11] Patent Number: 5,614,757

[45] Date of Patent: Mar. 25, 1997

[54] MONOLITHIC MULTILAYER CHIP INDUCTOR HAVING A NO-CONNECT TERMINAL

[75] Inventors: Herman R. Person; Jeffrey T. Adelman, both of Columbus, Nebr.; Bruce A. Tschosik, Yankton, S. Dak.; Thomas L. Veik; Scott D. Zwick, both of Columbus, Nebr.

[73] Assignee: Dale Electronics, Inc., Columbus, Nebr.

[21] Appl. No.: 548,555

[22] Filed: Oct. 26, 1995

[51] Int. Cl.[6] .......... H01L 29/00

[52] U.S. Cl. .......... 257/531; 257/528

[58] Field of Search .......... 257/531, 754, 257/758, 795, 528; 336/173, 223

[56] References Cited

U.S. PATENT DOCUMENTS 5,446,311 8/1995 Ewen et al. .......... 257/531

*Primary Examiner*—Carl Whitehead, Jr.
*Attorney, Agent, or Firm*—Zarley, McKee, Thomte, Voorhees, & Sease

[57] ABSTRACT

A monolithic multilayer ultra thin chip inductor is manufactured with two terminals on the same end of the component to reduce the mechanical stresses caused by a coefficient of expansion mismatch. A third no-connect terminal located on the opposite end may be used to mount the component when a more rigid connection is required. The inductor is constructed using a bottom and top coil layer, each having a coil and forming a termination point corresponding to the inductor terminals. The opposite ends of the coils form connection ends and are electrically connected to form a continuous coil from one terminal to the other. Optionally, a number of intermediate coil layers can be included between the bottom and top coil layers. The coil layers are selected from a set of coil layers. As a result, the total number of coil turns can be obtained by selecting the appropriate coil layers.

19 Claims, 5 Drawing Sheets

MONOLITHIC MULTILAYER CHIP INDUCTOR HAVING A NO-CONNECT TERMINAL

BACKGROUND OF THE INVENTION

1. Field of the Invention

The present invention relates to monolithic multilayer chip inductors. More particularly, the present invention relates to monolithic multilayer chip inductors using combinations of different coil layers to obtain a desired number of coil turns.

2. Problems in the Art

Typical prior art ultra thin inductors consist of two types. One type requires core assembly by the users, such as planar inductors where the coil is part of the printed circuit board. The second type is a planar inductor which is usually fragile and requires manual placement.

One problem encountered with the prior art chip inductors is caused by the expansion and contraction of a circuit board and inductor resulting from a change in temperature. When the ambient temperature changes, materials will expand or contract. Different materials expand and contract at different rates, depending on their coefficient of expansion. Since the coefficients of expansion of a circuit board and a chip inductor are different, the circuit board and chip inductor will expand and contract at different rates causing mechanical stresses on the ceramic component and on the circuit board to which it is soldered.

Another problem encountered in the prior art results from the demand for increasingly small sizes of components. For example, components to be mounted to a printed circuit board used in a PCMCIA card must be very thin. Various problems can result from reducing the size of a component. For example, as the size decreases, the electrical properties, reliability, and cost of prior art components is degraded.

Another problem with certain prior art chip inductors is the lack of versatility during the manufacturing process. Chip inductors are typically manufactured using several layers of coil patterns, including top, bottom, and intermediate layers. Each coil layer has connection ends corresponding to connection ends of the coil above and below it which are electrically connected to make a continuous coil. To determine the number of turns in a finished inductor, manufacturers change the number of intermediate coil layers positioned between the top and bottom layers, leaving the top and bottom layers the same. As a result, in order to line up the connection ends of each coil to make an electrical connection with the corresponding connection ends, two intermediate coil layers must be added at a time. This results in an inefficient use of coils as well as an increased thickness of the chip component. In addition, depending on the number of turns in each coil layer, the number of coils in the finished inductor can only be altered in relatively large increments.

FEATURES OF THE INVENTION

A general feature of the present invention is the provision of a monolithic multilayer ultra thin chip inductor.

A further feature of the present invention is the provision of a multilayer chip inductor having a bottom coil layer, a top coil layer, and optionally, at least one intermediate coil layer.

A further feature of the present invention is the provision of a multilayer chip inductor constructed by selecting certain intermediate and top coil layers to arrive at an inductor having a coil with a desired number of turns.

A further feature of the present invention is the provision of a multilayer chip inductor having a top termination layer selected from a plurality of top termination layers such that the total number of turns in the inductor coil can be selected at relatively small increments.

A further feature of the present invention is the provision of a multilayer chip inductor having two terminals located on the same end of the inductor.

A further feature of the present invention is the provision of a multilayer chip inductor having two terminals on the same end of the inductor and optionally a no-connection terminal on the opposite end.

A further feature of the present invention is the provision of a multilayer chip inductor having small enough dimensions to be used with Type I PCMCIA cards.

A further feature of the present invention is the provision of a multilayer chip inductor which is able to withstand higher solder reflow temperatures than similar wire wound inductors.

A further feature of the present invention is the provision of a multilayer chip inductor having superior electrical properties.

A further feature of the present invention is the provision of a multilayer chip inductor with the ability to store a large amount of energy compared to its small size A further feature of the present invention is the provision of a multilayer chip inductor constructed using a method which allows the inductor to be mass produced inexpensively.

A further feature of the present invention is the provision of a multilayer chip inductor constructed from coil layers having one and one-half turns each.

These as well as other features of the present invention will become apparent from the following specification and claims.

SUMMARY OF THE INVENTION

The monolithic multilayer ultra thin chip inductor and method for making same offers several advantages. First, two terminals of the inductor are located on the same end of the inductor. A third no-connect terminal is formed on the opposite end of the inductor. If coefficient of expansion mismatch is a problem, the two terminals can be soldered to a circuit board without soldering the no-connect terminal. This will reduce the mechanical stress on the component and circuit board. If it is necessary to mount the inductor to the circuit board in a more rigid or mechanically sound way, the no-connect terminal can also be soldered to the circuit board. Having the two inductor terminals on the same end of the inductor also allows for shorter trace runs on the printed circuit board.

The method of making the inductor of the present invention also offers several advantages. A bottom and top coil layer are constructed with each having a coil and forming a termination corresponding to the inductor terminals. The other ends of the coils form connection ends and are electrically connected to form a continuous coil from one terminal to the other terminal. The coil layers are selected from a set of coil layers, each having one turn or less than or more than one turn. In this way, the total number of coil turns can be easily selected by selecting different top coil layers.

Between the top and bottom coil layer, any number of intermediate coil layers may be included. A combination of bottom, top and intermediate coil layers is selected in order to obtain a desired number of coil loops. Also, when selecting the coil layers, the connection ends of each coil must correspond to the connection ends of the coils on either side of the layer in order to form a continuous coil from one terminal to the other terminal.

DETAILED DESCRIPTION OF THE PREFERRED EMBODIMENT

Figure 1:
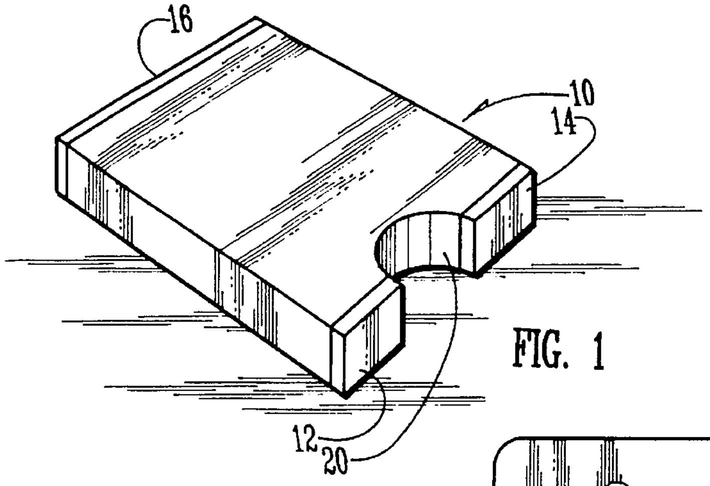
FIG. 1 is a perspective view of an embodiment of the inductor of the present invention.

The preferred embodiment of the present invention will be described as it applies to a chip inductor. It is not intended that the present invention be limited to the described embodiment. On the contrary, it is intended that the invention cover all alternatives, modifications and equivalencies which may be included within the spirit and scope of the invention.

Referring to the drawings, the numeral 10 generally designates the monolithic multilayer ultra thin chip inductor of the present invention. Inductor 10 is a monolithic thick film surface mount component. Inductor 10 includes two terminals 12 and 14 located on the same end of inductor 10. A third terminal 16 is a no-connect terminal located on the opposite end of inductor 10.

The user of inductor 10 has the option of soldering only the two terminals 12 and 14 to a circuit board, or to solder all three terminals 12, 14 and 16 to the circuit board. The no-connect terminal 16 makes no electrical connection with the coil within inductor 10. By soldering only terminals 12 and 14, the mechanical stresses on the ceramic component 10 are reduced. The mechanical stresses are caused by thermal expansion between component 10 and a circuit board to which it is soldered. These stresses are reduced since terminals 12 and 14 are closer together than terminal 16 and either of terminals 12 or 14.

If shock or vibration is more of a concern than the stresses caused by expansion and contraction, the user may solder all three terminals 12, 14 and 16 to the circuit board. As a result, inductor 10 will be more rigid and mechanically sound since it is soldered to the board in three places and at both ends.

Another advantage of having terminals 12 and 14 located at the same end of inductor 10 is that it allows for shorter trace runs on the circuit board. The trace runs connect terminals 12 and 14 to the other components soldered to the circuit board.

Figure 3:
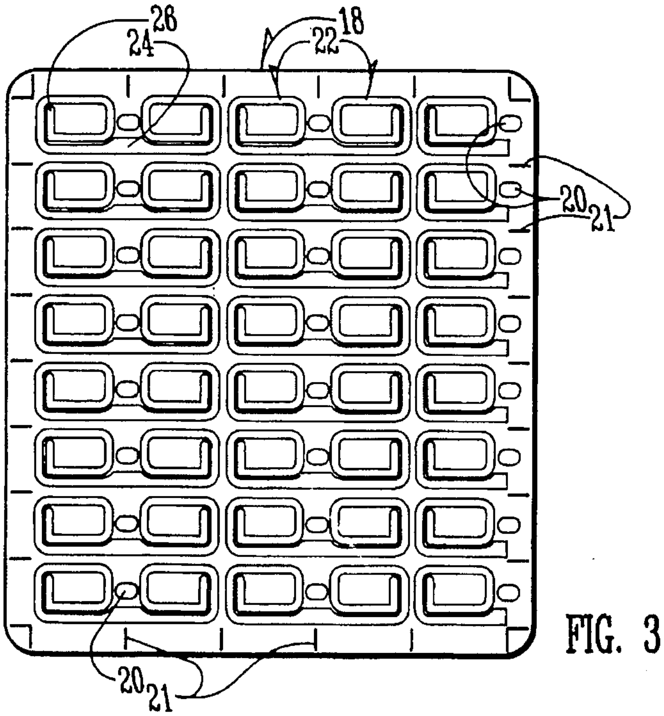
Figure 6:
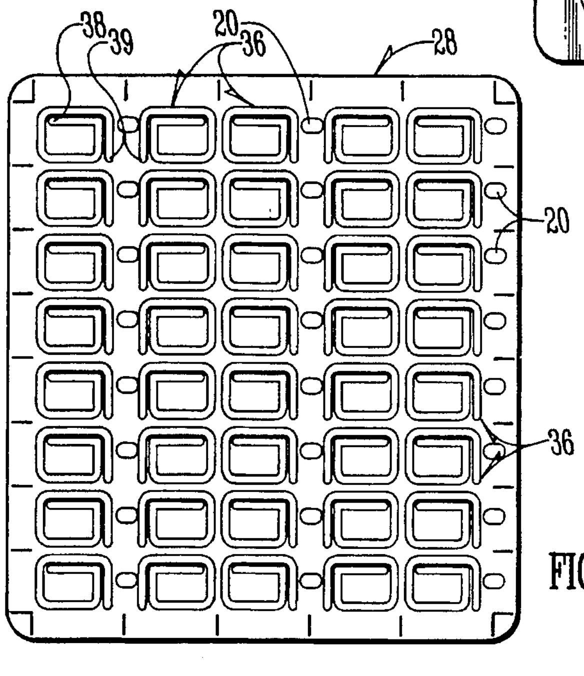
Figure 9:
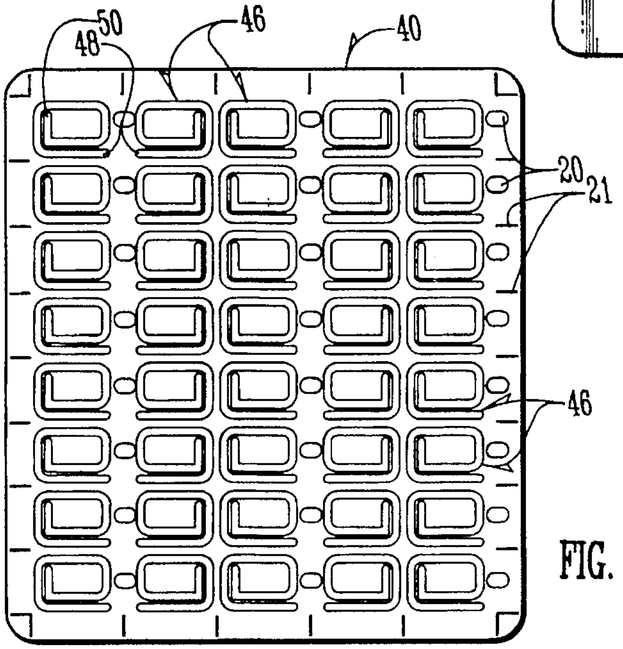

As shown in FIGS. 3, 6 and 9, each coil layer consists of one and one-half turns. Having one and one-half turns per coil layer allows more coil turns per given thickness than that allowed in the prior art. One and one-half turns per layer is the preferred method of manufacturing inductor 10, however, the number of turns per layer can vary. Less than one and one-half coil turns per layer would allow for wider traces increasing the current carrying capability, but as a result, part of the reduced thickness advantage is lost, as the overall thickness of the inductor must be increased to reach the same inductance. In other words, if the same thickness must be maintained, the maximum inductance obtainable is less. If more than one and one-half turns per coil layer are used, the thickness of the inductor required for a particular inductance is decreased. However, the trace width of the coils must be narrowed and the current carrying capability of the inductor would be reduced. As a result, one and one-half turns per coil layer are used for the preferred embodiment.

A major advantage of the present invention is its small size. The footprint of inductor 10 is often only ¼ that of the prior art. The preferred size is 0.375 inches in length, 0.25 inches in width, and 0.047 inches in thickness. However, the present invention could be made to fit almost any dimensions. The preferred size allows the part to be thin enough to fit in PCMCIA cards including Type I PCMCIA cards. Since PCM cards are small, the circuit board area is at a premium and the height restrictions preclude the use of through hole components. As a result, PCMCIA cards must use surface mount technology.

The most important features of the preferred embodiment are the superb electrical properties contained within such a small package. Inductor 10 has a high inductance. It is also very stable over a wide frequency range. The high inductance stability from 100 kHz up to 4 MHz makes the part excellent for use in DC to DC converters that typically operate at 500 kHz.

Inductor 10 has a Quality Factor (Q) which is much higher than the prior art at frequencies in the 200 kHz to 4 MHz range. The low resistive losses creates the high Q. The inductance stability along with the high Q, plus its 7 MHz SRF, combine to make the part operable at frequencies of at least 2.5 MHz.

The current rating and heat dissipation for inductor 10 are also excellent. At 500 kHz, the theoretical rated current that will generate a 20° C. temperature rise at 25° C. ambient is near 0.6 amps. At 1 MHz, the theoretical current rating is over 0.4 amps.

The structure of inductor 10 also makes it inherently shielded. It has an effective core geometry similar to a pot core. This results in low EMI radiating noise.

Figure 14:
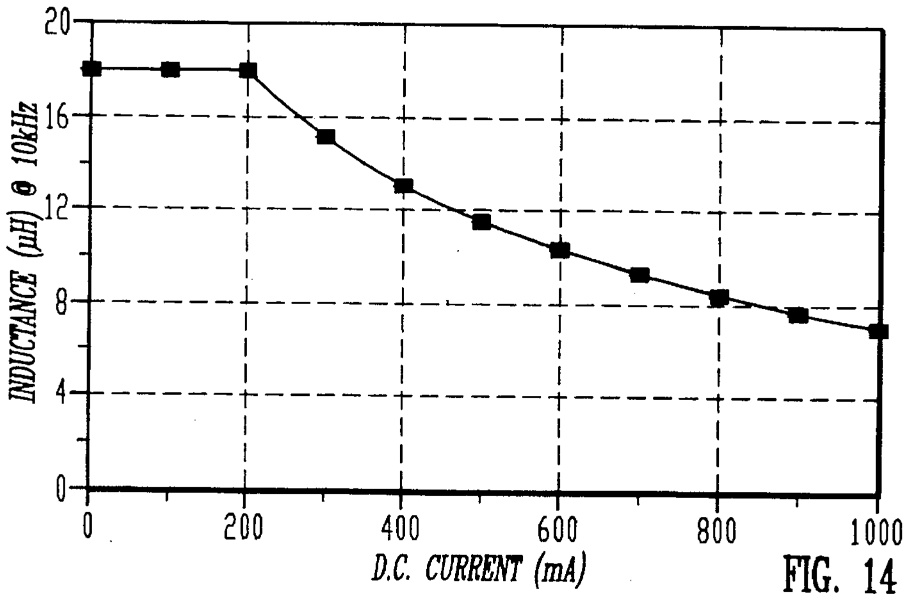
FIG. 14 is a graph showing the inductance of the present invention versus DC current.
Figure 15:
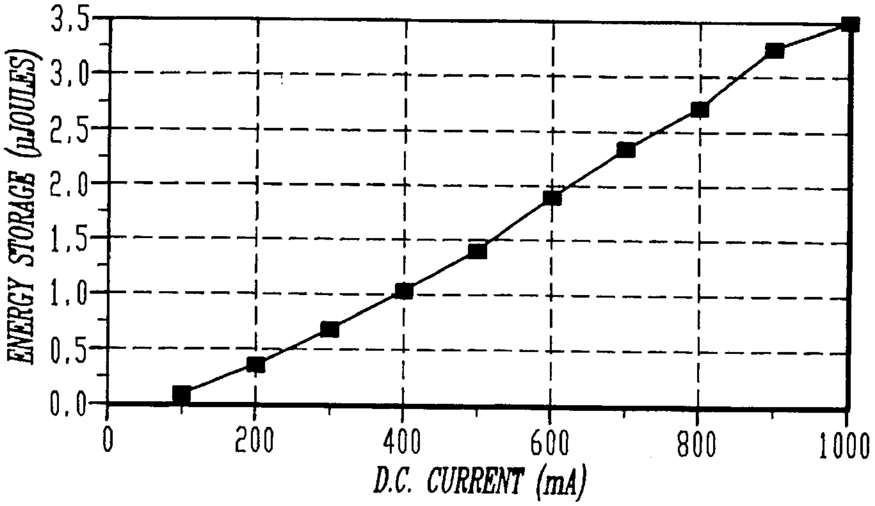
FIG. 15 is a graph showing the energy storage capability of the present invention versus DC current.

Another advantage of the present invention is its ability to store a large amount of energy compared to its small size. As shown in FIG. 14, the saturation of this inductor is "softer" than comparable parts. With typical prior art inductors, the inductance drops sharply when saturation occurs. In this case, however, the inductance drops gradually as more current is applied. This is demonstrated by the inductor's continued ability to store additional energy at higher D.C. current levels (see FIG. 15).

Inductor 10 is manufactured using most of the methods detailed in U.S. Pat. No. 5,302,932 "Monolithic Multilayer Chip Inductor and Method For Making Same", patent application, U.S. Ser. No. 08/336,538, "Electronic Thick Film Component Multiple Terminal and Method for Making Same", and patent application, U.S. Ser. No. 08/336,491, "Electronic Thick Film Component Termination and Method for Making Same". All three references are hereby incorporated by reference.

While a single inductor 10 is shown in FIG. 1, the method for producing a plurality of inductors 10 is shown in FIGS. 2–13.

Figure 2:
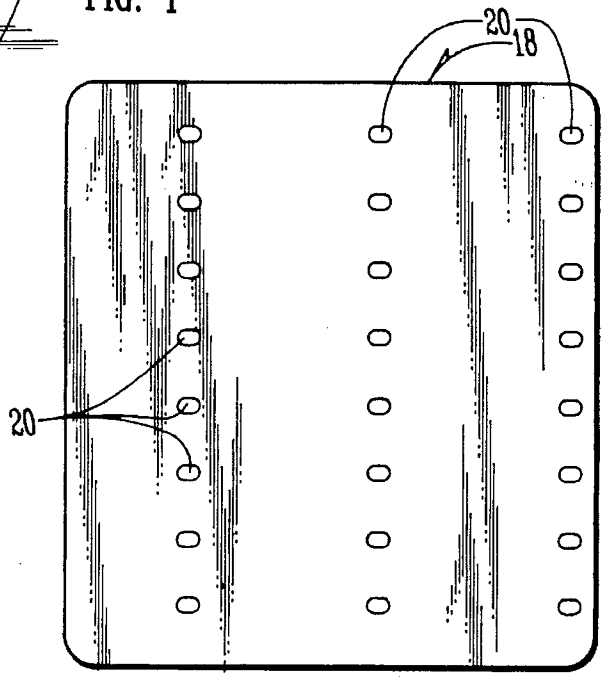
FIGS. 2 through 13 are views showing the various printing stages of the process for manufacturing the embodiment shown in FIG. 1.

FIG. 2 shows the ferrite base or bottom cap layer 18. The bottom cap layer 18 is printed until it reaches a thickness that allows for an appropriate magnetic path. The thickness is determined by the number of coils the final part will have. FIGS. 1–13 all show holes 20 formed on the layers. The purpose of the holes is to form a separation between the terminals 12 and 14 after the individual components are cut apart (best shown in FIG. 1).

FIG. 3 shows the bottom cap layer 18 with a coil 22 having one and one-half turns printed on it. One end 24 of the coil 22 extends to the edge of the component 10 and makes contact to terminal 12 shown in FIG. 1. The other end of the coil 22 terminates at a location one and one half turns from the first end. This end forms a connection end 26 which will connect with a corresponding connection end of a coil on the next layer.

Figure 4:
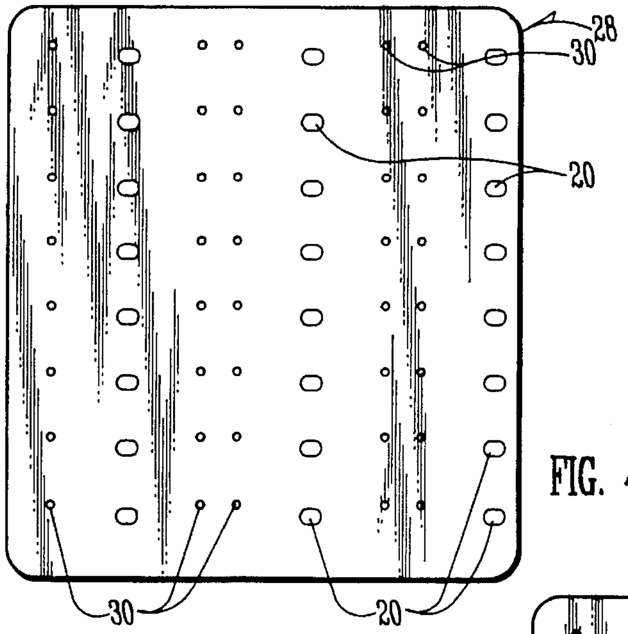

A first ferrite layer 28 is then printed as shown in FIG. 4. The first ferrite layer 28 includes a via hole 30 for each individual component 10 and corresponds to the connection end 26 of the bottom coil 22.

Figure 5:
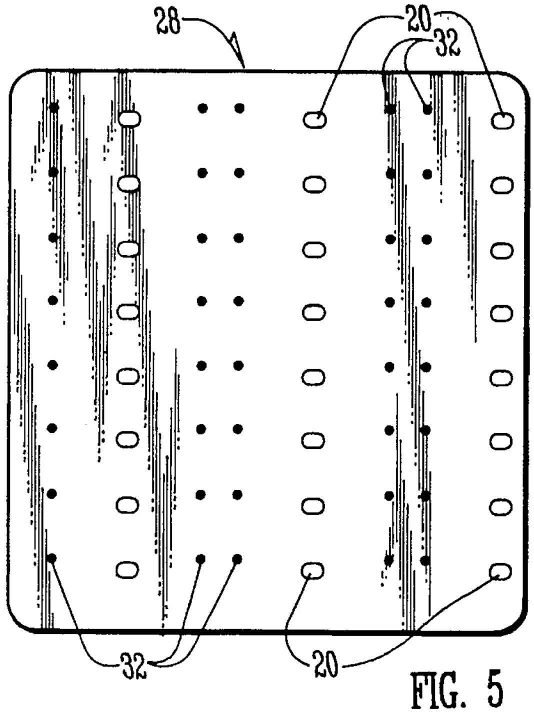

As shown in FIG. 5, the via holes 30 are filled by the first via fills 32.

FIG. 6 shows the intermediate ferrite layer 28 with a first intermediate coil 36 printed on it. The first intermediate coil 36 has one and one-half turns, with one connection end 38 corresponding to the connection end 26 of the bottom termination coil 22 and a second connection end 39 corresponding to a connection end on the next layer. The connection ends 26 and 38 are electrically connected by the first via fill 32.

Figure 7:
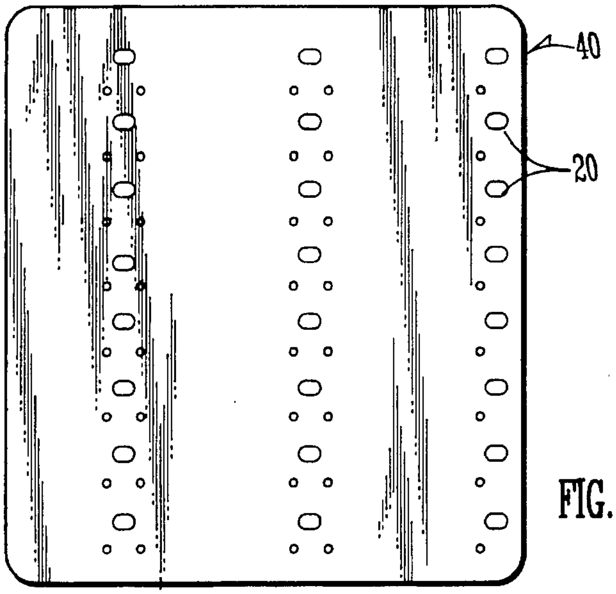
Figure 8:
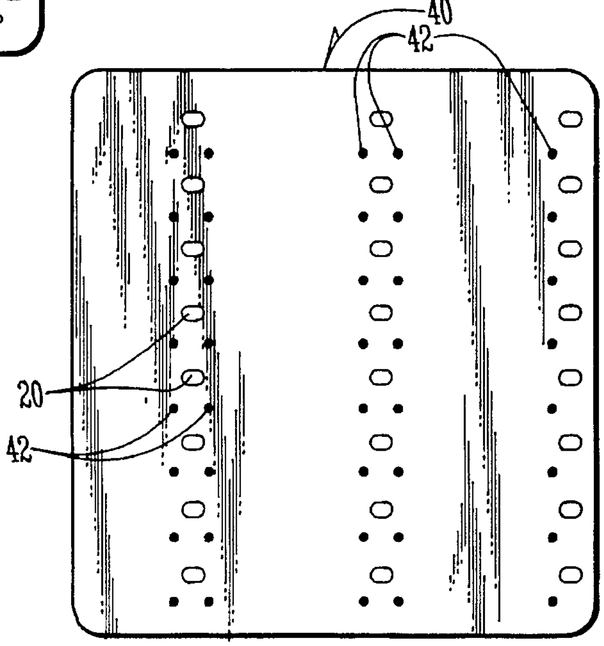

FIG. 7 shows the second ferrite layer 40 which is analogous to the first ferrite layer 28 shown in FIG. 4. In the same way, FIG. 8 shows the second via fill 42 which is analogous to the first via fill 32 shown in FIG. 5.

FIG. 9 shows the second ferrite layer 40 with second intermediate coils 46 printed on it. The second intermediate coils 46 each have one and one-half turns. The second intermediate coil 46 has a first connection end 48 corresponding to the connection end 39 of the first intermediate coil 36 and is electrically connected by the second via fill 42. The other end of coil 46 has a second connection end 50 corresponding to a connection end on the next layer. Additional coil layers may be added by repeating intermediate layers shown in FIGS. 4–9 as needed depending on the desired number of turns.

Figure 10:
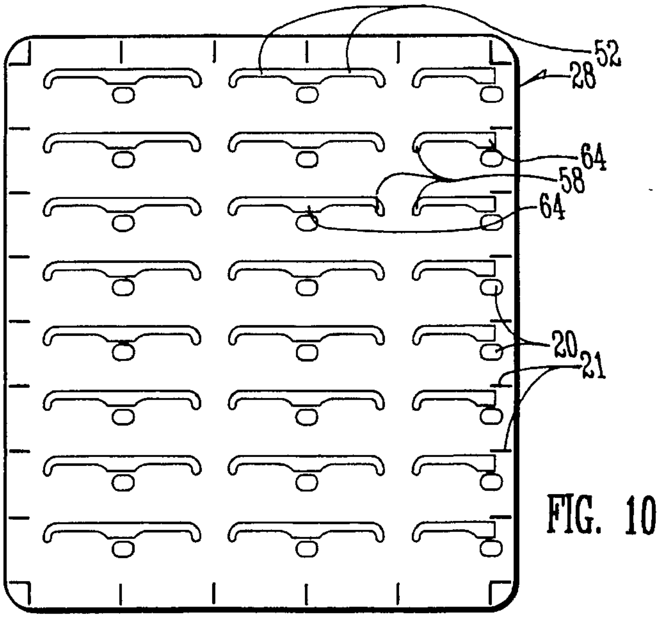
Figure 11:
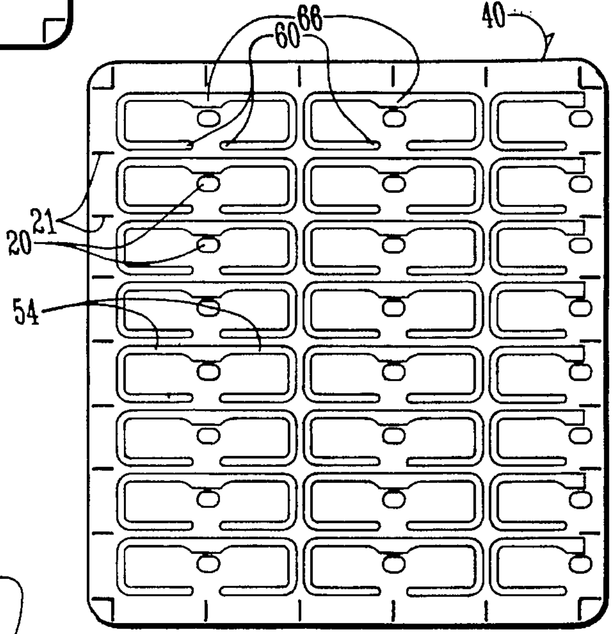
Figure 12:
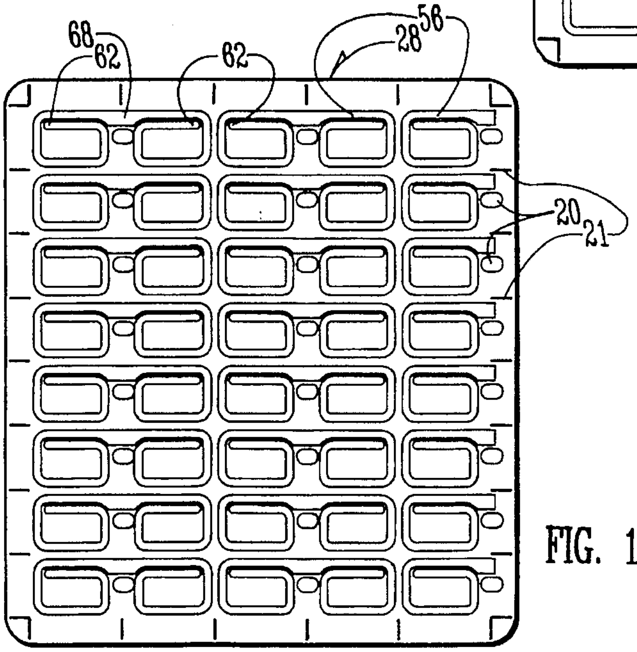
Figure 13:
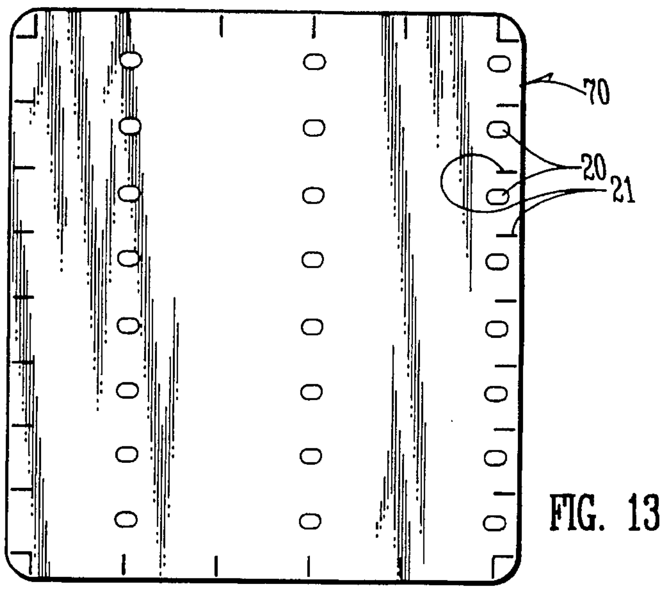

FIGS. 10 through 12 show three possible top termination coils 52, 54, and 56. The top termination coils are printed over an intermediate ferrite layer (such as ferrite layers 28 and 40) and a via fill layer (such as via fill layers 32 or 42). The top termination coils extend to the edge of component 10 and are electrically connected to terminal 14 (FIG. 1). Either of the three top termination coils may be used as discussed below.

The artwork for inductor 10 includes three different top termination layers (FIGS. 10–12). Without three different top termination coils, in order to increase or decrease the number of coils in inductor 10, the number of coils would have to increase or decrease by three turns. This would have the undesirable effect of limiting the increments of coils in inductor 10 to three.

When selecting the top termination coil, at least two things should be considered. First, the connection end of the top termination coil must correspond to the second connection end of the coil on the previous layer so that an electrical connection can be made. For example, as shown in the figures, first and third top termination coils 52 and 56 have connection ends 58 and 62 respectively. Connection ends 58 and 62 correspond to connection ends 50 (FIG. 9) and 26 (FIG. 3), but not connection end 39 (FIG. 6). In other words, first and third top termination coils 52 and 56 can be used after bottom termination coil 22 or second intermediate coil 46 (after first adding an intermediate ferrite layer 28 and a via fill layer 32), but not after first intermediate coil 36. Similarly, second top termination coil 54 can only be used after first intermediate coil 36 since connection end 60 corresponds with connection end 39 of first intermediate coil 36. This same reasoning is used when selecting other layer combinations. The second consideration is the number of coil turns desired. For example, when choosing a top termination coil, notice that the coils on first termination coil 52 have one quarter turn while the coils on second and third top termination coils 54 and 56 have three quarters, and one and one-quarter turns respectively. The top termination coils 52, 54, and 56 each have a termination end 64, 66, and 68, respectively, which each extends to the edge of inductor 10 and is electrically connected to terminal 14 shown in FIG. 1.

Inductor 10 is manufactured by layering the bottom termination coil 22 (FIG. 3) and one of the three top termination coils 52, 54, or 56 (FIGS. 10–12). Between the bottom termination layer and the top termination layer, the maker of inductor 10 has the option of layering no other coils, first intermediate coil 36, first and second intermediate coil 36 and 46, or first and second intermediate coils 36 and 46 along with additional first and second intermediate coils, etc., as long as the connection ends of each individual coil correspond to the connection ends of the coil below and above it so that an electrical connection can be made by the via fills. Table 1 provides a guide to possible combinations of coil layers and the resulting number of coil turns.

It should also be understood that the terms "bottom" or "top" do not necessarily mean that only the "bottom" layer can be the first layer made in the manufacturing process. The terms "bottom" and "top" were simply chosen to make FIGS. 2–13 clear.

Because terminals 12 and 14 are positioned relative to each other as shown in FIG. 1, the total number of turns is never a whole number. Inductor 10 always has a whole number of coil turns plus an additional three-fourths of a coil.

Table 1 shows the coil layer progression needed to reach a particular coil turn count. The table shows the inner coil layers only and not the bottom cap 18 (FIG. 2) or the top cap (FIG. 13) which is identical to the bottom cap 18. Each combination of coil layers begins with the bottom coil 22 (FIG. 3). After the bottom coil 22, either the first intermediate coil 36 (FIG. 6), the first top termination coil 52 (FIG. 10), or the third top termination coil 56 (FIG. 12) can be printed. If the first top termination coil 52 is printed on top of the bottom coil 22, an inductor with 1¾ coils is formed. If the third top termination coil 56 is added to the bottom coil 22, an inductor with 2¾ coils is formed. If the first intermediate coil 36 is added to the bottom coil 22, then either the second intermediate coil 46 or the second top termination coil 54 can be printed. If the second top termination coil 54 is printed, then an inductor having 3¾ coils is formed. If the second intermediate coil 46 is printed over the first intermediate coil 36, then the maker has the option of next adding another first intermediate coil 36, the first top termination coil 52, or the third top termination coil 56. This pattern can be repeated as shown in Table 1 to make an inductor having any number of coils in increments of one.

After one of the three top termination coils is printed, the cap layer 70 is printed until the part reaches the desired thickness. The marks 21 are used to align the cuts across the wafer to cut apart the plurality of components 10.

After the part is printed, each layer is dried at an elevated temperature for several minutes. The preferred drying parameters are ten minutes at 100° C.

After the final layer has been dried, the wafer is cut into individual parts and then fired. The preferred firing temperature is 900° C.

The magnetic material used to manufacture inductor 10 also contributes to the excellent electrical characteristics that the present invention possesses. Preferably, inductor 10 is constructed of zinc, nickel, and Ni—Zn ferrite thick film paste, manufactured by Heraeus, Inc., Cermalloy Division, part No. IP9050.10.

The preferred embodiment of the present invention has been set forth in the drawings and specification, and although specific terms are employed, these are used in a generic or descriptive sense only and are not used for purposes of limitation. Also, this invention applies to any other electronic thick film components requiring a connection between the inner conductors and the outer terminals of the component.

Changes in the form and proportion of parts as well as in the substitution of equivalents are contemplated as circumstances may suggest or render expedient without departing from the spirit or scope of the invention as further defined in the following claims.

TABLE 1

| Coil Turns | Layers |
|---|---|
| 1 ¾ | BT,F1,V1,TT1 |
| 2 ¾ | BT,F1,V1,TT3 |
| 3 ¾ | BT,F1,V1,C1,F2,V2,TT2 |
| 4 ¾ | BT,F1,V1,C1,F2,V2,C2,F1,V1,TT1 |
| 5 ¾ | BT,F1,V1,C1,F2,V2,C2,F1,V1,TT3 |
| 6 ¾ | BT,F1,V1,C1,F2,V2,C2,F1,V1,C1,F2,V2,TT2 |
| 7 ¾ | BT,F1,V1,C1,F2,V2,C2,FI,V1,C1,F2,V2,C2,F1,V1,TT1 |
| 8 ¾ | BT,F1,V1,C1,F2,V2,C2,F1,V1,C1,F2,V2,C2,F1,V1,TT3 |

BT = Bottom Termination
V1 = 1st Via Fill
F2 = 2nd Ferrite
C2 = 2nd Intermediate Coil
TT2 = 2nd Top Termination
Fl = 1st Ferrite
Cl = 1st Intermediate Coil
V2 = 2nd Via Fill
TT1 = 1st Top Termination
TT3 = 3rd Top Termination

What is claimed is:

1. A monolithic multilayer chip inductor comprising:

a coil encapsulated within a body having two ends, said coil having first and second ends;

a first terminal electrically connected to the first end;

a second terminal electrically connected to the second end;

a third terminal formed on the body and making no electrical contact with the coil, the third terminal being formed from a solderable material;

wherein the first and second terminals are positioned on the body at one end and the third no-connect terminal is positioned on the body at the opposite end.

2. The monolithic multilayer chip inductor of claim 1 wherein each of the terminals is formed on the body such that the terminals do not extend from the body substantially.

3. The monolithic multilayer chip inductor of claim 1 wherein said body is comprised of a plurality of layers.

4. The monolithic multilayer chip inductor of claim 3 wherein said coil is comprised of a plurality of coil portions, each of said coil portions being formed on one of said layers.

5. The monolithic multilayer chip inductor of claim 4 wherein at least one of said coil portions is comprised of one and one half turns.

6. The monolithic multilayer chip inductor of claim 1 wherein the inductor is adapted to be mounted to a printed circuit board and wherein said third terminal is solderable to the printed circuit board.

7. The monolithic multilayer chip inductor of claim 1 wherein the first and second terminals are formed on the body at one end in close proximity to each other in order to minimize the trace runs on a board on which the inductor is mounted.

8. A monolithic multilayer chip inductor comprising:

a body having a bottom adapted to lie parallel to a printed circuit board and having a plurality of sides;

a coil encapsulated within the body, said coil having first and second ends;

a first terminal electrically connected to the first end of the coil;

a second terminal electrically connected to the second end of the coil;

a third terminal positioned on a first side of the body, the third terminal comprising a conductive material; and wherein the first and second terminal are each positioned on a second side of the body.

9. The monolithic multilayer chip inductor of claim 8 wherein said second side of the body is positioned opposite of the first side of the body.

10. The monolithic multilayer chip inductor of claim 8 wherein said third terminal does not make electrical contact with the coil.

11. The monolithic multilayer chip inductor of claim 10 wherein the chip inductor is mounted to a circuit board by soldering the first and second terminals to the circuit board.

12. The monolithic multilayer chip inductor of claim 11 wherein said third terminal is also mounted to the circuit board to provide a rigid mount to the circuit board where shock or vibration of the operating environment is of concern.

13. The monolithic multilayer chip inductor of claim 11 wherein said third terminal is not soldered to the circuit board in order to reduce the mechanical stresses on the chip inductor caused by the thermal expansion between the chip inductor and the circuit board.

14. The monolithic multilayer chip inductor of claim 11 wherein said first and second terminals are formed on the second side of the body in close proximity to each other to allow for shorter trace runs on the circuit board.

15. The monolithic multilayer chip inductor of claim 8 wherein each of said terminals are formed on the body and do not extend substantially from the sides of the body.

16. The monolithic multilayer chip inductor of claim 8 wherein said body is comprised of a plurality of layers, at least some of said layers including a coil portion which together form the coil.

17. A monolithic multilayer chip inductor comprising:

a plurality of layers stacked together to form a multilayer component having a top, bottom, and sides;

a plurality of coil portions, each formed on one of said layers, said plurality of coil portions being electrically coupled together to form a single coil having a first and second end;

first and second terminals positioned at a first side of the component, said first terminal being electrically connected to the first end of said coil, said second terminal being electrically connected to the second end of the coil; and a third terminal formed at a second side of the component, the third terminal being formed from a solderable material.

18. The monolithic multilayer chip inductor of claim 17 wherein the third terminal is electrically isolated from the plurality of coil portions.

19. The monolithic multilayer chip inductor of claim 17 wherein at least one of said plurality of coil portions being one and one half turns.

* * * * *